United States Patent
Alperin et al.

(10) Patent No.: US 7,282,925 B2
(45) Date of Patent: Oct. 16, 2007

(54) APPARATUS TO FACILITATE FUNCTIONAL SHOCK AND VIBRATION TESTING OF DEVICE CONNECTIONS AND RELATED METHOD

(75) Inventors: Joshua N. Alperin, Round Rock, TX (US); Jeffrey M. Cardwell, Austin, TX (US); Matthew J. McGowan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 365 days.

(21) Appl. No.: 10/972,752

(22) Filed: Oct. 25, 2004

(65) Prior Publication Data

US 2006/0107118 A1    May 18, 2006

(51) Int. Cl.
*G01R 31/04* (2006.01)
*G01R 31/26* (2006.01)

(52) U.S. Cl. .................................... 324/538; 324/765
(58) Field of Classification Search ................ 324/538, 324/537, 500, 556, 512, 509, 510, 765
See application file for complete search history.

(56) References Cited

U.S. PATENT DOCUMENTS

| | | | |
|---|---|---|---|
| 4,130,794 A * | 12/1978 | Cox ............................ 324/538 |
| 4,912,980 A | 4/1990 | Baughn ........................ 73/663 |
| 5,589,719 A * | 12/1996 | Fiset ........................... 307/131 |
| 6,088,660 A * | 7/2000 | Uno et al. ................... 702/130 |
| 6,344,748 B1 * | 2/2002 | Gannon ....................... 324/542 |
| 6,348,800 B1 * | 2/2002 | Haensgen et al. ........... 324/500 |
| 6,467,353 B1 | 10/2002 | Genix et al. .................. 73/662 |
| 6,614,253 B2 * | 9/2003 | Berkely ...................... 324/765 |
| 6,633,491 B2 | 10/2003 | Malone et al. .............. 361/825 |
| 6,678,627 B1 | 1/2004 | Starr ........................... 702/119 |
| 6,940,288 B2 * | 9/2005 | Barr et al. .................. 324/525 |
| 7,075,310 B2 * | 7/2006 | Mason et al. ............... 324/538 |
| 2004/0073834 A1 * | 4/2004 | Kermaani et al. ............ 714/13 |
| 2004/0246003 A1 * | 12/2004 | Bryndzia et al. ........... 324/556 |

* cited by examiner

*Primary Examiner*—Vincent Q. Nguyen
*Assistant Examiner*—Hoai-An D. Nguyen
(74) *Attorney, Agent, or Firm*—O'Keefe, Egan, Peterman & Enders LLP

(57) ABSTRACT

An apparatus and associated method are disclosed for facilitating the testing of device connections, including functional shock and vibration testing of peripheral card slots or any other desired connector interface. In part, a power supply located on the peripheral device, or some other external power source, is used to power fault detection circuitry. In this way, faults can be identified, such as through visual fault indicators, without the necessity of powering the system. In addition, simulated peripheral cards are provided that include adjustable weights so that the weight distribution of an actual card can be simulated without the necessity of having a functional peripheral in hand.

15 Claims, 4 Drawing Sheets

APPARATUS TO FACILITATE FUNCTIONAL SHOCK AND VIBRATION TESTING OF DEVICE CONNECTIONS AND RELATED METHOD

TECHNICAL FIELD OF THE INVENTION

This invention relates to shock and vibration testing of mechanically connected electrical devices and, more particularly, to such testing for peripheral cards connected to slots in a computer chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

When information handling systems, such as computer systems, are shipped to customers, failures can occur due to the shock and vibrations experienced by the system. For example, in a shipping environment, peripheral cards have the potential to "rock-up" to where the gold finger connectors on the card lose electrical continuity with contacts on the connector within the chassis. For any new platform or product, this rock-up condition is typically tested during shock and vibration test cycles. After shipping to customers, rock-up is often the cause of a significant number of initial product failures reported in the field. This failure rate can be particularly significant with larger form factor chassis.

With respect to peripheral cards, shock and vibration testing can be difficult to accomplish. In the case of technology transitions, such as a PCI bus to a PCI-Express (PCI-E) bus transition, functional peripheral devices are often not available early in the testing cycle. In addition, the functional systems within which the peripheral device will be included may not yet be available where the testing is occurring early in the development cycle for a new functional system. A further difficulty arises in the ability to identify when a peripheral card has rocked out of position because with current shock and vibration testing techniques, continuity of connection cannot be determined without first powering on the system. To power the system in traditional test environments, however, external power sources must be connected, thereby lengthening and complicating test cycles. In addition, the actual weight distribution of the peripheral card, in addition to the connector mechanics, may be a factor in connection faults that actually occur in the field. As such, when no functional peripheral cards are available for testing, the weight distribution for these functional peripheral cards is often difficult to take into consideration using traditional shock and vibration testing techniques.

SUMMARY OF THE INVENTION

The present invention provides an apparatus and associated method for facilitating the testing of device connections, including functional shock and vibration testing of peripheral card slots or any other desired connector interface. In part, a power supply located on the peripheral device, or some other external power source, is used to power fault detection circuitry. In this way, faults can be identified, such as through visual fault indicators, without the necessity of powering the system under test (SUT). In addition, simulated peripheral cards are provided that include adjustable weights so that the weight distribution of an actual card can be simulated without the necessity of having a functional peripheral in hand.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

As described below in detail below, an apparatus and associated method are disclosed for facilitating the testing of device connections, including functional shock and vibration testing of peripheral card slots or any other desired connector interface. In part, a power supply located on the peripheral device, or some other external power supply, is used to power fault detection circuitry so that faults can be identified without the necessity of powering the system. In addition, adjustable weights are provided so that the weight distribution of an actual peripheral card can be simulated without the necessity of having a functional peripheral in hand. Example embodiments are now described in further detail with respect to the drawings.

Figure 1A:
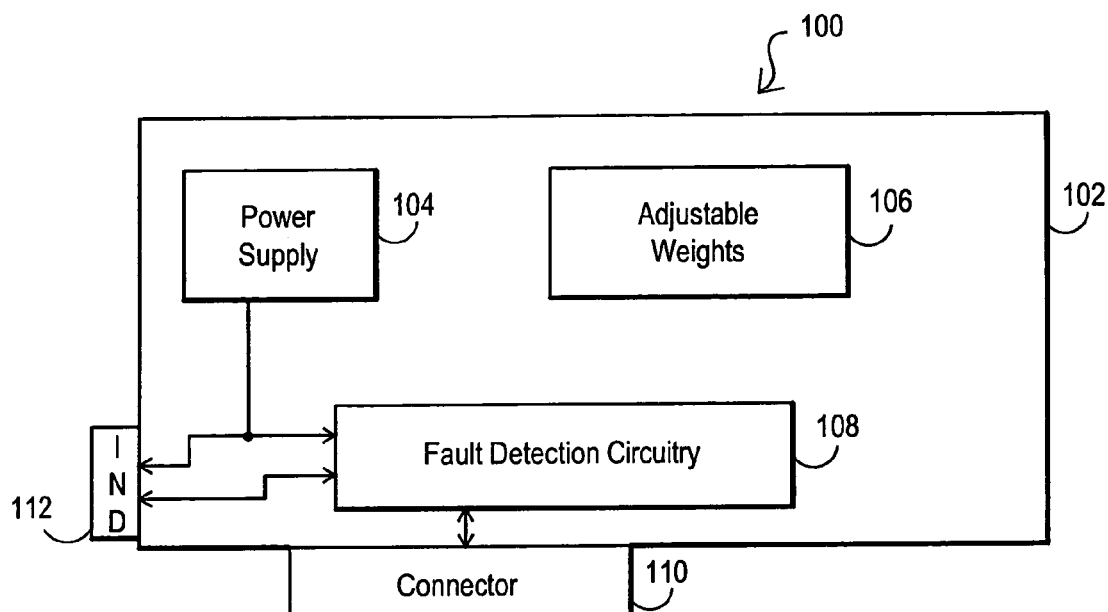
FIG. 1A is a block diagram for a peripheral test apparatus.

FIG. 1A is a block diagram for a peripheral test apparatus 100 including a peripheral device body 102. The peripheral device in turn includes a mechanical connector 110 for making an electrical connection with another device and adjustable weights 106 for simulating weight distributions where functional cards are not available. In the embodiment depicted, the peripheral device body 102 is configured to be a peripheral card. This system 100 also includes an on-card power supply 104, fault detection circuitry 108, and a fault indicator (IND) 112. The fault indicator (IND) 112 can be, for example, a visible fault indicator such as a light emitting diode (LED). The on-card power supply 104 provides power to the fault detection circuitry 108 and the fault detector 112 so that power does not have to be supplied to the system. If desired, some other external power supply could also be utilized. The fault detection circuitry monitors the condition of the connections on the connector I 10 to determine if a fault has occurred. The fault detector 112 provides an overall fault indicator and is preferably visible so that a fault condition can be determined by viewing the fault indicator 112. Where the peripheral test apparatus 100 is a peripheral card that can be connected to a bus on a computer motherboard, for example, a visible fault detector 112, such as an LED, can be positioned such that it can be seen from the back of the chassis without opening the chassis. As such, success or failure can be determined simply by looking at the back of the chassis. In addition, as discussed below, the fault detection circuitry 108 can also include additional fault indicators, such as LEDs, that indicate more precisely which pins or connections within connector 110 failed. The adjustable weights 106 are particularly helpful for simulated peripheral devices where the weight distribution of a peripheral device is desired to be simulated. Example circumstances where this is helpful include times when a functional peripheral card is not available or times when it is desirable not to use the actual peripheral card in the shock and vibration testing. If desired, the adjustable weights 106 can include configurable weight distributions in the positive and/or negative directions of the X, Y and Z axes, such that both the number of weights, the amount of the weights and the location of the weights can be configured to simulate the weight distribution of a functional peripheral card. Thus, in addition to being configured to be adjustable in the amount of weight, the adjustable weights 106 can be configured to adjustable in the location of those weights on the peripheral device body. This adjustability can be achieved in any desired manner, and an example weight adjustment system is discussed with respect to FIG. 1B below.

The power supply 104 is provided so that the system within which the peripheral test apparatus 100 is designed to be placed does not have to be powered. Rather, power supply 104 can provide the power utilized by the peripheral test apparatus 100 during operation. As depicted in FIG. 1A, the peripheral test apparatus 100 is a peripheral card, and the power supply 104 is an on-card power supply. As such, the power supply 104 can be implemented as one or more batteries, such as readily available coin-cell batteries used to provide power to BIOS circuitry on computer motherboards. An example battery that could be used is a 3-volt coin-cell battery having the designation CR2032. The power supply 104 could be implemented with other power sources, if desired. For example, external power sources that are not coupled to the device body 102 could be utilized to provide power to the peripheral test apparatus 100. Such power sources, for example, could provide power through wired or wireless connections to the peripheral test apparatus 100, as desired. Power could also be provided by an external power source through the connector 110, if such an implementation were desired. Thus, any of a wide variety of power sources configurations could be utilized for providing power to the test apparatus 100, including the use of power supply circuitry located on the device body 102, as depicted in FIG. 1A.

Figure 1B:
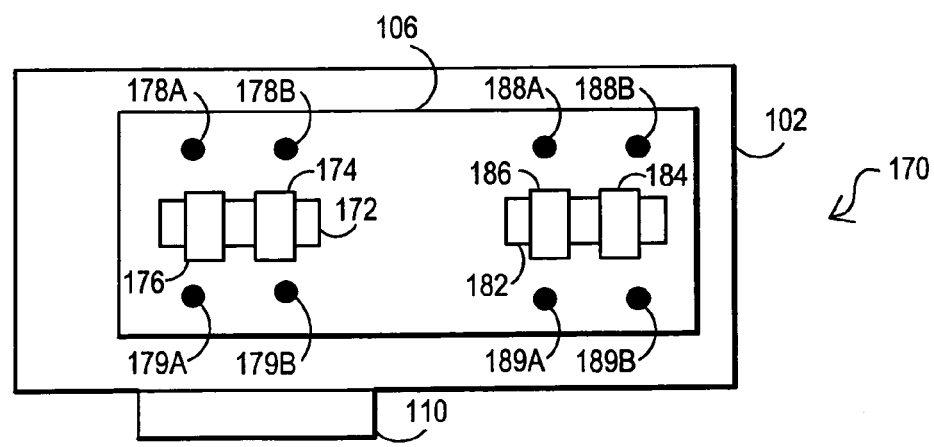
FIG. 1B is a block diagram for an adjustable weight distribution system.

FIG. 1B is a block diagram of an example system for adjustable weights 106. For the example embodiment depicted, the peripheral device body 102 is configured to be a peripheral card, and the adjustable weights section 106 includes two sections of configurable weights. One weight system includes bar 172, as well as weights 174 and 176, and is located above the connector 110. The other weight system includes bar 182, as well as weights 184 and 186, and is located toward the end of the card. Looking to the first system, the bar 172, to which the individual weights are connected, can be adjusted up or down in the Y-direction using alternative connection holes 178A, 178B or 179A, 179B. Thus, as depicted, there are three possible Y-axis positions for the simulated weight system depending upon where the bar 172 is fastened (another set of connection holes are located the bar 172 is shown). The positionable weights 174 and 176 can be adjusted in the X-direction along bar 172, and the amount of these weights can be selected to simulate the weight and position of the functional card. The second weight system is similarly adjustable along the Y-axis using bar 182 and alternative connection holes 188A, 188B or 189A, 189B. The second weight system is similarly adjustable along the X-axis using positionable weights 184 and 186. It is also noted that adjustments along the Z-axis could be provided if desired by allowing for adjustments to be made to the distance bars 172 and 182 are from the surface of the peripheral card 102. In addition, one or more of the weight systems could be connected to the back of the card to adjust in the opposite Z-axis direction. And additional weight systems could be provided on the front or the back of the card, as desired, to achieve a greater degree of precision in simulating the weight distribution of the functional peripheral card. Variations to the example weights systems are possible, as desired, while still utilizing the adjustable weight feature of the present invention that allows for weight distribution simulation of devices, such as functional peripheral cards.

Figure 1C:
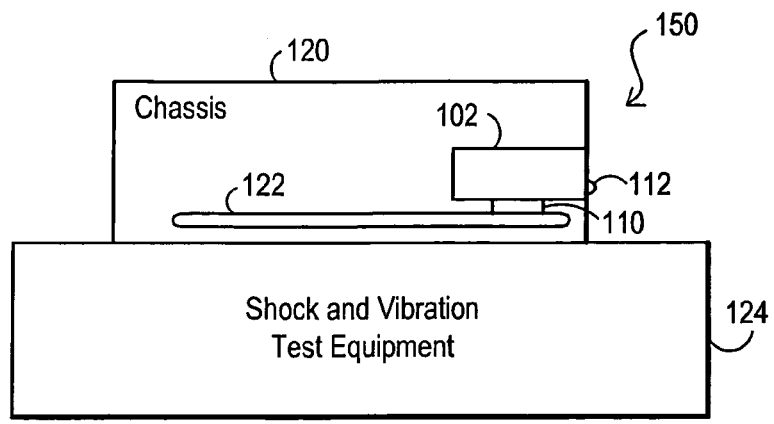
FIG. 1C is a block diagram on a shock and vibration testing environment.

FIG. 1C is a block diagram of a shock and vibration testing environment 150 that can be used to test peripheral or device connections. Block 124 represents the test equipment being used to provide the shock and vibration testing. This shock and vibration testing equipment 124 may be, for example, a computer controlled table upon which a chassis 120 is connected. Where the chassis is a computer chassis, a motherboard 122 will be connected inside the chassis. The device body 102 for the peripheral apparatus 100 will be seated within the chassis, and appropriate connectors will be located on the motherboard 122 to allow connection to connector 110. The fault indicator 112 is preferably a visible indicator and is positioned such that it will be visible on the back of the peripheral device body 102, which will typically be visible from the back of the chassis 120. Where the chassis 120 is a computer chassis and the peripheral device body 102 is configured to be a peripheral card, the fault indicator 112 can be located in a visible location on the back of the peripheral card panel. It is noted that the chassis can be configured as desired and, for example, can be configured to hold components of an information handling system including a first device body having a connector that is configured to connect to a second device body, such as a peripheral device body.

Figure 2A:
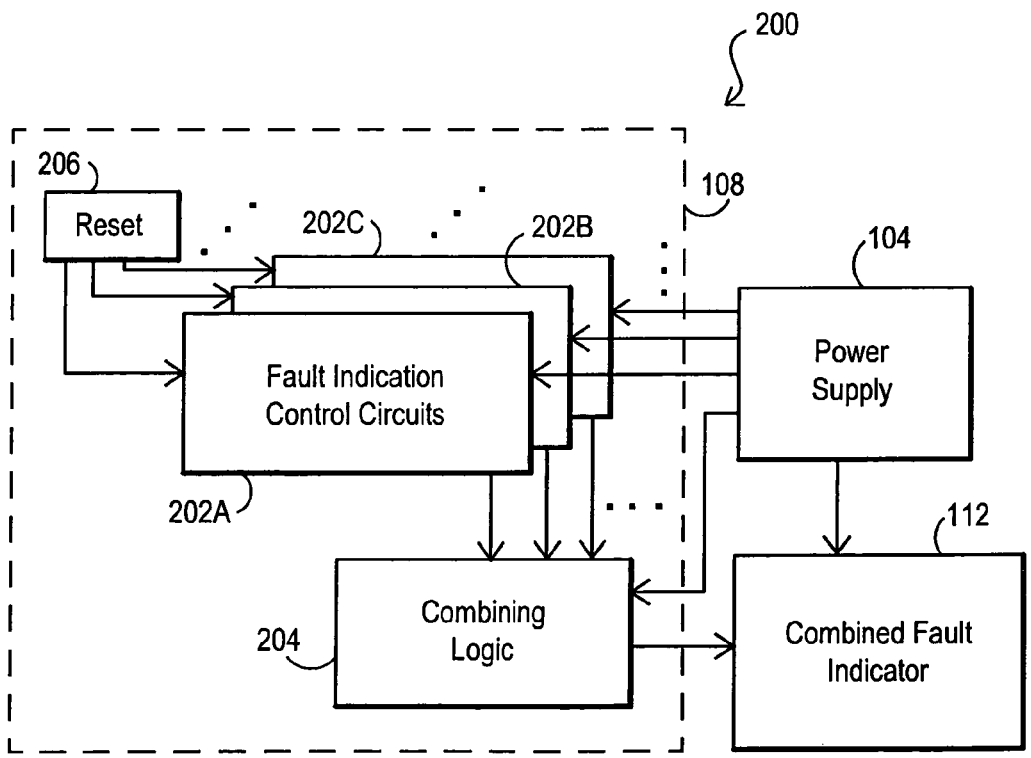
FIG. 2A is a block diagram for fault detection circuitry included on the peripheral device.

FIG. 2A is a block diagram for fault detection circuitry 108 included on the peripheral device body 102. In the embodiment 200 depicted, power supply 104 is connected to the combined fault indicator 112, the combining logic 204, and the fault indication control circuits 202A, 202B, 202C, etc. Also as depicted, the fault detection circuitry 108 includes reset block 206, combining logic 204 and control circuits 202A, 202B, 202C, etc. The fault indication control circuits 202A, 202B, 202C, etc. can be utilized to provide a greater degree of specificity with respect to which portion of the connector 110 failed. It is noted that the number of fault indicators, the type of fault indicators, and related logic circuitry can be selected depending upon the nature of the fault indication desired for a particular application. In operation, the reset block 206 is used to reset or initialize the control circuits 202A, 202B, 202C, etc. to an initial state. The reset block 206 can include a reset button and associated circuitry that produces a reset signal when pressed, and a reset indicator can be provided to indicate that the reset button has been pressed. This reset indicator, for example, can be an LED that momentarily lights when the reset button is pressed. Each control circuit 202A, 202B, 202C, etc. is connected to at least one connection point for connector 110 and indicates whether or not a failure has occurred for that connection point during connection testing. Each of the control circuits 202A, 202B, 202C, etc. provides an output to combining logic 204, which in turn controls the combined fault indicator 112. The logic circuitry for combining logic 204 can be configured such that if any of the control circuits 202A, 202B, 202C, etc. indicates that a failure has occurred, the combined fault indicator 112 will trigger. Where the combined fault indicator 112 is a visible fault indicator, such as an LED, this trigger event can cause a visible change in the combined fault indicator 112, thereby allowing a fault condition to be determined merely by looking at the back of the chassis under test. It is noted that other logic and indicators could be provided depending upon the output indications desired. It is further noted that the logic circuitry could be implemented as discrete logic or could be implemented using a programmable controller, such as a programmable logic device (PLD), microcontroller, or other programmable processing circuitry.

Figure 2B:
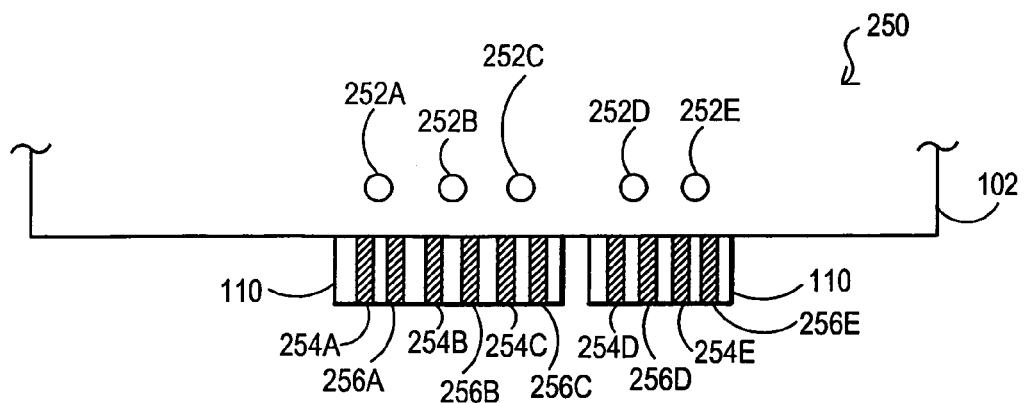
FIG. 2B is a diagram of an example connector for a peripheral card along with associated LED fault indicators.

FIG. 2B is a diagram of an example connector system 250 for a peripheral device body 102 along with associated fault indicators 252A, 252B, 252C, 252D and 252E that have been selected to be LED fault indicators. Initially, it is noted that connector system 250 is merely intended for example purposes. Different buses, such as PCI, PCI-B, ISA, AGP, etc., included different connector arrangements. And the present invention is equally applicable to these buses or any other connector system desired, such as ball grid, pin in hole, plug in socket etc. Such systems provide electrical connections between devices through mechanically interfaced connectors. As stated above, the present invention is effective for testing connector interfaces of any device connection that can become disconnected or otherwise file due to shock or vibrations suffered by the system. By utilizing the present invention, a plurality of signal, ground or voltage supply connections. For the example embodiment depicted in FIG. 2B, the connector system 250 is intended to represent PCI-E bus connections on one side of the peripheral card, where related GND and signal connections are side by side. Connector stripes 254A, 254B, 254C, 254D and 254E represent ground (GND) connections for connector 110. Connector stripes 256A, 256B, 256C, 256D and 256E represent signal connections for connector 110. Similar gold finger connections would be repeated on the opposite side of connector 110 for a PCI-E bus connection. In the embodiment depicted, an LED fault indicator is included for each of the GND connections. In particular, LED fault indicator 252A is associated with GND connection 254A. LED fault indicator 252B is associated with GND connection 254B. LED fault indicator 252C is associated with GND connection 254C. LED fault indicator 252D is associated with GND connection 254D. And LED fault indicator 252E is associated with GND connection 254E. As such, if a fault occurs with respect to a GND connection during shock and vibration testing, the appropriate LED fault indicator will provide a visual indication of that fault. It is noted that different embodiments could be designed and configured to use non-ground connections, if desired. It is further noted that depending upon the design selected for the LED control circuits 202A, 202B, 202C, etc., the LED fault indicators 252A, 252B, 252C, 252D and 252E can signal a fault either by being on or by being off. It is further noted that similar fault indicators to those described below could be provided on the opposite side of the device body 102, as well. Thus, with respect to the example PCI-E bus embodiment in FIG. 2B, five fault indicators would appear on each side of the device body 102 and provide signals to combining logic 204.

It is also noted that fault indicators other then visible fault indicators, such as LEDs, could be utilized, if desired. Also, if desired, the fault states for connections could be stored in memory device, such as an on-card memory device, and these fault conditions could be polled and stored at regular time intervals so that information concerning the timing of faults during testing could be determined. Memory devices that could be utilized include SRAM, DRAM and FLASH memories, FLASH systems such as removable or portable FLASH memory cards and memory sticks, and/or fixed or removable hard disks or any other desired recordable storage media. This time based tracking of faults would be helpful, for example, where a peripheral card becomes unseated at some point during the shock and vibration test but becomes seated by the end of the test. In addition, the time at which the connection was lost could be correlated to the test script so that the nature of the event that caused the fault could be determined. Still further, circuitry could be provided on the peripheral device that allows for wireless or wired communication to external devices that could record fault information during the test cycle or provide measurement processing. In addition, other data gathering devices could be included with respect to the peripheral device, such as accelerometers or other sensors. Other variations could be also be implemented, as desired, utilizing the on-card power supply to provide power for electronically controlling and recording testing results.

Figure 3A:
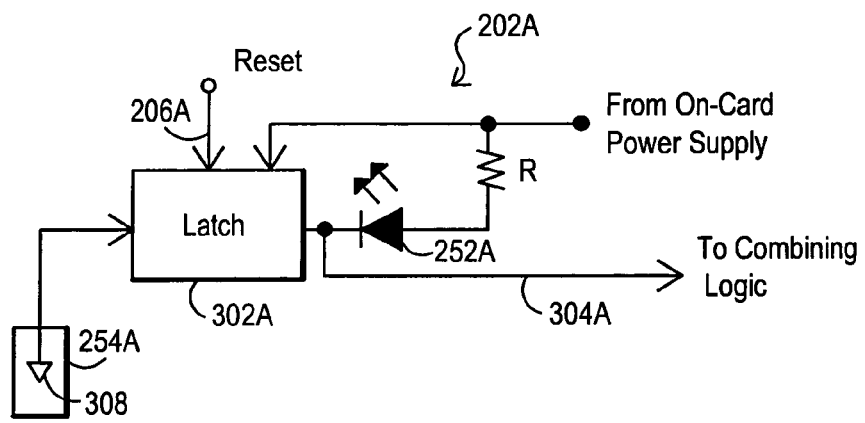
FIG. 3A is a circuit diagram for fault indicator control circuitry.

FIG. 3A is an example of a circuit diagram for LED fault indicator control circuit 202A. If desired, a latch 302A and an LED 252A can be provided for each GND pin or connection within the connector 110. As shown in the embodiment depicted, the GND connection stripe 254A is connected to a latch 302A and is connected to ground 308 for the connector 110. It is noted that for the PCI-E slot embodiment discussed above, the ground 308 to which connection stripe 254A is connected as part of connector 110 is effectively chassis ground. PCI-E is basically a point-to-point bus, with the ground pins on the connector not specifically part of the bus itself. The ground for the on-board battery or power supply can also be connected to chassis ground via the bracket holding the card 102 in place. This bracket makes contact with the back of the chassis, as can be seen in FIG. 1C. All grounds in the test system, therefore, can be configured as chassis grounds because the ground layer of the board 122 is connected to the chassis via the screw holes that couple the board 122 to the chassis 120. As discussed above, the system within the chassis 120 and the PCI-E bus are not required to be operating or powered for the purposes of this invention.

Looking back to FIG. 3A, the latch 302A receives a RESET signal 206A from the reset block 206 and receives power from the on-card power supply 104. An LED 252A is connected through resistor R (e.g., 100 ohms) between the on-card power supply 104 and the output of latch 302A. The output of the latch 302A is also provided to the combining logic as represented by line 304A. For the testing cycle, the peripheral card is first properly seated into the connector within a chassis. The initial connection for the ground stripe connection 254A, therefore, is good. The latch is then initially reset to a high logic level output using the RESET signal 206A. In this embodiment, therefore, the LED 252A is initially turned off to indicate a good connection. Where the power supply is an on-board battery, for example, this selection of an off condition representing a good connection helps to save battery life because the LED 252A is off in the normal, good connection condition. The shock and vibration testing is then executed. If GND connection stripe 254A loses connection during test to the system ground for connector 110, it will lose its state of being connected to ground provided by the on-card power supply 104, thereby causing the latch to trip to a different state. The output of the latch 302A will then become a low logic level, thereby allowing current to flow through the LED 252A and turning it on. This on state of LED 252A indicates a connection fault has occurred during testing. It is noted that for this embodiment, if the peripheral card reseats such that the GND connection stripe 254A makes good contact at a later point in the test, the latch 302A is configured to maintain a low logic level, and the LED 252A will remain on. If the GND connection stripe 254A maintains proper connection through to the end of the test, the latch will have a high logic level output, and the LED 252A will be off, indicating a good connection has been maintained. As discussed above, the LED control circuit 202A also provides a fault indication signal 304A to combining logic 204. This fault indication signal 304A is connected to the output of latch 302A, is a logic high as long as a good connection is maintained throughout the test, and is a logic low if a connection fault occurs at any point during the test.

It is again noted that different logic circuitry could be utilized, if desired. For example, the latch 302A could be eliminated so that the fault indicator 252A would always show the current state of the connection. In other words, if the connection stripe 254A became reseated during test and a good connection existed at the end of the test, the fault indicator 252A would indicate a good connection, as would the fault indication signal 304A that is provided to the combining logic. In addition, if desired, an additional fault indicator could be added to the embodiment of FIG. 3A so that both a latched fault condition could be indicated by fault indicator 252A and an unlatched fault condition could be indicated. The latched fault condition would provide information about whether a fault condition occurred at any time during the test, and the unlatched fault condition would provide information about whether a fault condition existed at the end of the test.

In one implementation, a D flip-flop latch circuit can be used for the latch 302A. And this D flip-flop can be configured such that it will output a signal indicating that a fault has occurred if a connection is lost at any time during the test. In particular, the D input to the D flip-flop latch can be set to a high logic level, for example, by connecting it to a logic high voltage, such as 3 volts. This logic high connection provides a constant, known input state for the D input. The clock of the D flip-flop latch is edge triggered and attached to a ground pin on the card edge connector 110. As discussed above, the connector 110, when properly seated, is configured to be effectively connected to the chassis ground even though the system is not powered. When the connection to ground is broken (indicating a fault), this fault event causes the CLOCK input to transition high due to a pull-up on the input (shown in more detail in FIG. 4 below) and thereby causes the high logic level at the D input to be clocked into the D flip-flop latch. The inverted output (Q_BAR) of the D latch circuit is utilized as an active low signal to either reverse bias the LED 252A (Q_BAR high turning LED off, RESET state) or sink current through the LED (Q# low turning LED on, FAULT state). Thus, in operation, a fault event changes the state of the D flip-flop latch by triggering the CLOCK line of the D flip-flop latch and not by triggering the D logic input, which has been held at a high logic level. Once the fault event occurs, the output remains at a high logic level regardless of whether the connector 110 reseats. A short event at any point during the test, therefore, will create a permanent (until RESET) record a failure condition. It is noted that the reset signal (RESET) 206A is coupled to the reset input of the D flip-flop latch.

Figure 3B:
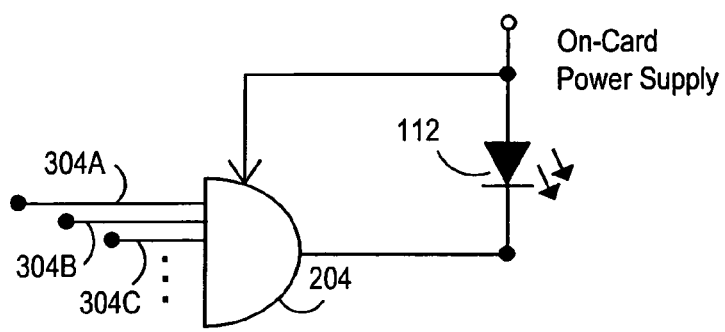
FIG. 3B is a circuit diagram for combining logic circuitry along with the associated fault indicator.

FIG. 3B is a circuit diagram for combining logic circuitry 204 along with the associated overall LED fault indicator 112. In this embodiment, an AND gate is utilized for combining circuitry 204. The AND gate 204 receives the fault indicator signals 304A, 304B, 304C, etc. from the LED control circuits. In operation, if all the inputs to AND gate 204 are logic high levels indicating good connections, the output of AND gate 204 will be high, and the LED fault indicator 112 will be off. If any one of the inputs to the AND gate 204 goes low indicating a fault, the output of AND gate 204 will go low, and the fault indicator 112 will be on. Thus, in this embodiment, an overall fault condition is indicated by a low logic level on the combined fault indication signal output by AND gate 204 and, therefore, by the LED fault indicator 112 being on. If desired, the chassis can then be opened so that the individual LED fault indicators 252A, 252B, 252C, 252D and 252E can be viewed to determine which connections were lost. And it is again noted that any number of internal fault indicators may be used as desired and that the type and nature of the fault indicators utilized could be modified if desired.

Figure 4:
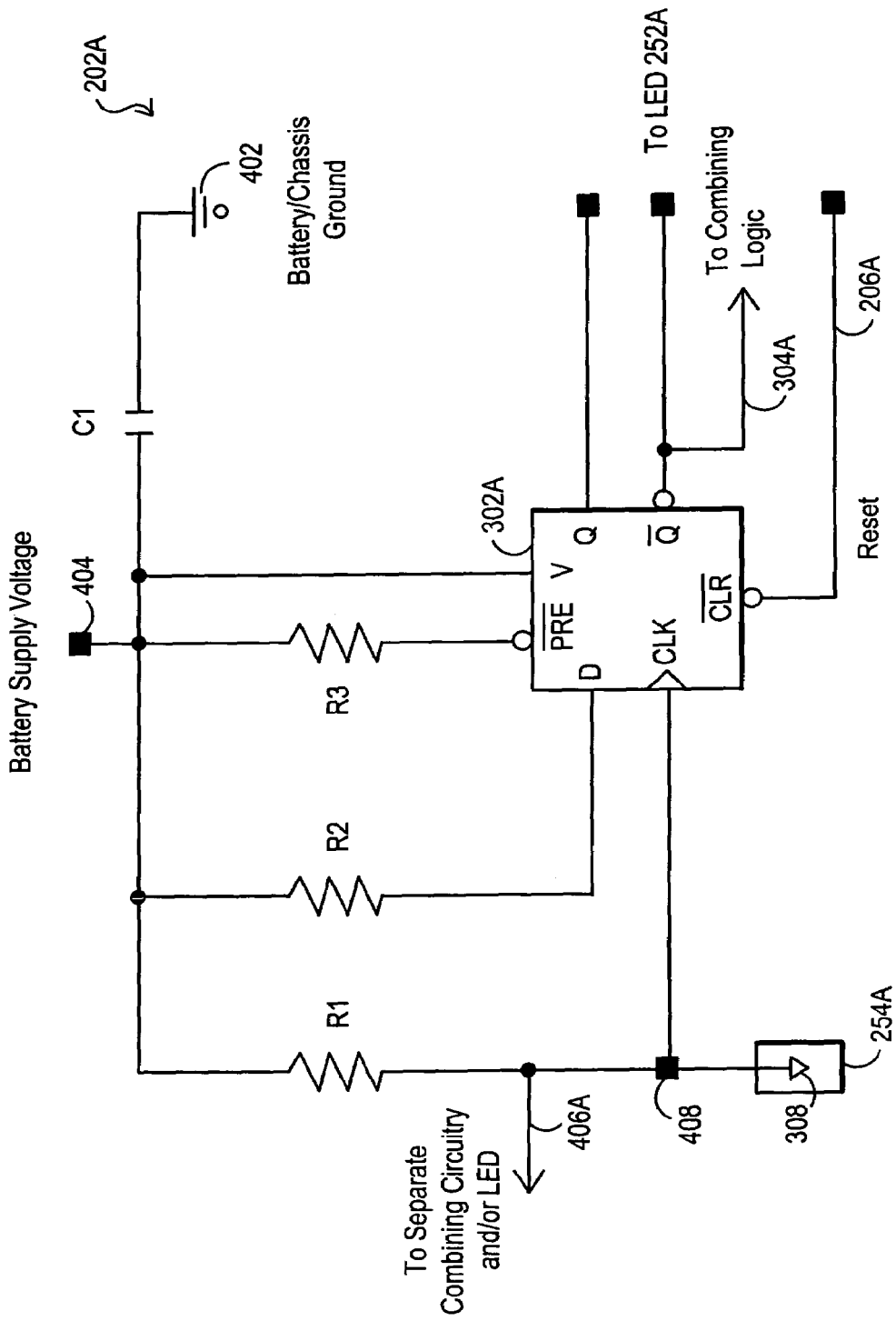
FIG. 4 is a more detailed circuit diagram for fault indicator control circuitry.

FIG. 4 is a more detailed block diagram for fault indicator control circuit 202A that utilizes a D flip-flop (e.g., 74VHC74) for logic circuitry 302A. As with FIG. 3A, the GND connection 254A is coupled to chassis ground as is the battery ground 402. The battery supply voltage is connected at node 404. If desired, a decoupling capacitor C1 (e.g., 0.1 micro-farad) can be connected between the battery supply voltage and battery ground. A resistor R3 (e.g., 10 k ohms) is connected between that battery supply voltage and the power reset (PRE_) input to the D flip-flop 302A. A resistor R2 (e.g., 10 k ohms) is connected between that battery supply voltage and the data (D) input to the D flip-flop 302A. The battery supply voltage is connected to the voltage supply (V) input to the D flip-flop 302A. The RESET signal 206A is connected to the clear (CLR_) or reset input of the D flip-flop 302A. The non-inverted output (Q) of the D flip-flop 302A is not utilized in this embodiment. The inverted output (Q_) is connected to LED 252A, as depicted in FIG. 3A, and is connected to the combining logic through connection 304A. A resistor R1 (e.g., 10 k ohms) is connected between that battery supply voltage 404 and node 408. Node 408 is connected to the clock (CLK) input to the D flip-flop 302A and to the GND connection 254A.

As noted above, circuitry could be utilized, if desired, to identify the current connection state for connector 110. And combination logic could be utilized, if desired, to identify the overall current connection state for connector 110. In the embodiment of FIG. 4, a signal 406A (and as similar signal from each fault detection control circuit 202) can be connected to a fault indicator, such as an LED. This signal 406A will then provide an indication of the current state for the GND connector 254A. As with the combining logic 204 depicted in FIG. 3B, similar logic circuitry could be provided to receive the current state fault indication signals from each fault detection control circuit 202, such as signal 406A, and to provide an output signal indicative of the combined current connection state for the connector 110.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein and certain features of the invention may be utilized independently of the use of other features, all as would be apparent to one skilled in the art after having the benefit of this description of the invention.

What is claimed is:

1. An apparatus for testing device connections, comprising:
    a device body having a connector configured to be coupled to another device;
    a power source coupled to provide power to the device body; and
    fault detection circuitry coupled to the connector and to the power source and configured to output at least one fault indication signal with respect to the connector when a connection fault occurs;
    wherein the device body is configured to provide weight distribution simulation for another device; and further comprising one or more adjustable weights configured to be coupled to the device body to provide the weight distribution simulation.

2. The apparatus of claim 1, wherein the power source comprises power supply circuitry located on the device body.

3. The apparatus of claim 1, wherein the device body comprises a peripheral card for an information handling system.

4. The apparatus of claim 1, wherein the connector comprises a plurality of connections, and further comprising a plurality of fault indicators such that each fault indicator is associated with at least one connection and further comprising a plurality of control circuits such that each control circuit is associated with at least one fault indicator, the control circuits being configured to output a plurality of fault indication signals to control the fault indicators.

5. The apparatus of claim 4, further comprising combining logic coupled to receive a plurality of fault indication signals from the control circuits and to provide as an output a combined fault indication signal.

6. The apparatus of claim 1, wherein a location for at least one of the weights is configured to be adjustable.

7. An information handling system for shock and vibration testing of device connections, comprising:
    a chassis configured to hold components for the information handling system;
    a power supply for the information handling system coupled to the chassis;
    a first device body and a second device body, the first device body being coupled to the chassis and being electrically coupled to the power supply, the first device body having at least a first connector configured to be coupled to the second device body, and the second device body having a second connector configured to be coupled to the first connector of the first device body;
    a power source coupled to provide power to the second device body, the power source being different from the power supply for the information handling system; and
    fault detection circuitry coupled to the second device body, to the second connector and to the power source and configured to output at least one fault indication signal when a connection fault occurs between the first connector for the first device body and the second connector for the second device body during a connection test procedure;
    wherein the second device body is configured to provide weight distribution simulation for another device; and further comprising one or more adjustable weights configured to be coupled to the second device body to provide the weight distribution simulation.

8. The information handling system of claim 7, wherein the first device body comprises a motherboard having a slot connector as the first connector and the second device body comprises a peripheral card having a card edge connector as the second connector.

9. The information handling system of claim 8, wherein the peripheral card has a panel located at least at one end, and further comprising a visible fault indicator located on the panel so as to be viewable from outside the chassis.

10. The information handling system of claim 9, wherein the power source comprises power supply circuitry located on the second device body, wherein the first device body and the second device body have a common ground, wherein at least one ground connection on the second connector for the second device body is coupled to the common ground through the first connector for the first device body, and wherein the fault detection circuitry is configured to output a fault indication signal if a connection fault occurs between the ground connection and the common ground.

11. The information handling system of claim 7, wherein the connector comprises a plurality of connections and further comprising a plurality of fault indicators coupled to the plurality of connections.

12. A method for facilitating testing of device connections, comprising:
- coupling a connector of a first device body to a connector on a second device body;
- powering connection fault detection circuitry on the first device body; and
- generating at least one fault indication signal with respect to the connector on the first device body when a connection fault occurs during testing of the device connections; and
- adjusting a weight distribution for the first device body to simulate weight distribution for another device.

13. The method of claim 12, wherein the powering step comprises powering connection fault detection circuitry on the first device body utilizing power supply circuitry located on the first device body and providing a common ground between the first device body and the second device body.

14. The method of claim 12, further comprising utilizing at least one visible fault indicator configured to indicate connection faults.

15. The method of claim 12, wherein the generating step comprises generating at least one fault indication signal indicating whether a connection fault occurred at any time during testing and generating at least one fault indication signal indicating a current condition for connection continuity.

* * * * *